US008589837B1

(12) United States Patent
Baumgartner et al.

(10) Patent No.: US 8,589,837 B1
(45) Date of Patent: Nov. 19, 2013

(54) CONSTRUCTING INDUCTIVE COUNTEREXAMPLES IN A MULTI-ALGORITHM VERIFICATION FRAMEWORK

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/455,839

(22) Filed: Apr. 25, 2012
(Under 37 CFR 1.47)

(51) Int. Cl.
*G06F 17/50* (2006.01)

(52) U.S. Cl.
USPC ............ 716/104; 716/101; 716/106; 716/111

(58) Field of Classification Search
USPC .......................... 716/101, 104, 106, 111, 136
See application file for complete search history.

(56) References Cited

U.S. PATENT DOCUMENTS

| 7,203,631 | B2 | 4/2007 | Fraer et al. | |
| 7,581,170 | B2 * | 8/2009 | Baumgartner et al. | 715/234 |
| 7,596,770 | B1 * | 9/2009 | Kuehlmann et al. | 716/106 |
| 7,661,082 | B1 | 2/2010 | McMillan et al. | |
| 7,865,339 | B2 | 1/2011 | Rushby et al. | |
| 8,001,498 | B2 | 8/2011 | Bjesse | |
| 8,181,134 | B2 * | 5/2012 | Baumgartner et al. | 716/107 |
| 8,255,848 | B2 * | 8/2012 | Baumgartner et al. | 716/108 |
| 2010/0005454 | A1 | 1/2010 | Sankaranarayanan et al. | |
| 2010/0223584 | A1 | 9/2010 | Baumgartner et al. | |

OTHER PUBLICATIONS

Wedler et al.,"Exploiting State Encoding for Invariant Generation in Induction-based Property Checking"; 2004, IEEE Design Automation Conference, Proceedings of the ASP-DAC 2004, pp. 424-429.*
Hiang et al.,"Inductive Equivalence Checking under Retiming and Resynthesis", 2007 IEEE/ACM International Conference on Computer-Aided Design, Conference Publication pp. 326-333.*
Baumgartner et al.,"Optimal Constraint-Preserving Netlist Simplification", Mar. 2008, IBM Corporation, Department of ECE, University of Texas at Austin; viewgraphs 35 pages.*
Chang et al., Simulation-based Bug Trace Minimization with BMC-based Refinement, IEEE 2005.
Chou et al., Facilitating Unreachable Code Diagnostics and Debugging, IEEE 2011.

* cited by examiner

*Primary Examiner* — Sun Lin
(74) *Attorney, Agent, or Firm* — Yudell Isidore Ng Russell PLLC (57) ABSTRACT

A computer-implemented method simplifies a netlist, verifies the simplified netlist using induction, and remaps resulting inductive counterexamples via inductive trace lifting within a multi-algorithm verification framework. The method includes: a processor deriving a first unreachable state information that can be utilized to simplify the netlist; performing a simplification of the netlist utilizing the first unreachable state information; determining whether the first unreachable state information can be inductively proved on an original version of the netlist; and in response to the first unreachable state information not being inductively provable on the original netlist: projecting the first unreachable state information to a minimal subset; and adding the projected unreachable state information as an invariant to further constrain a child induction process. Adding the projected state information as an invariant ensures that any resulting induction counterexamples can be mapped to valid induction counterexamples on the original netlist before undergoing the simplification.

20 Claims, 5 Drawing Sheets

CONSTRUCTING INDUCTIVE COUNTEREXAMPLES IN A MULTI-ALGORITHM VERIFICATION FRAMEWORK

BACKGROUND

1. Technical Field

The present disclosure generally relates to verification techniques for integrated circuit logic design and in particular to techniques for constructing inductive counterexamples in a multi-algorithm verification framework.

2. Description of the Related Art

Formal verification techniques are powerful tools for the construction of correct logic designs. These verification techniques have the power to expose even the most probabilistically uncommon scenario that may result in a functional design failure, and ultimately, the techniques have the power to prove that the design is correct, i.e., that no failing scenario exists. Unfortunately, formal verification techniques require computational resources, and these computational resources are exponential with respect to the size of the design under test, requiring, in a worst case scenario, the analysis of every "reachable state" of a given design.

One approach that has demonstrated powerful potential to extend the capacity of automated formal verification techniques is the use of an interactive framework to control the dispatching of verification problems into an automated toolset, and to build upon results obtained from the toolset. For example, an expert human may interact with a theorem proving system to attempt to prove an extremely complex problem. In such paradigms, it is often the case that "induction" is used to solve the problem. And, in particular, inductive proofs seek to demonstrate that design states which do not violate properties within a given number of time-frames cannot violate properties within a larger number of time-frames. One major benefit of inductive techniques is that they do not rely upon expensive characterizations of reachable state sets, as often the property under verification may be demonstrated as correct from an arbitrary state which does not lead to a shallow failure of the property under verification. However, in general, inductive techniques are inconclusive since it may be the case that a property which does not fail requires a tighter characterization of the reachable states than is possible using induction reasoning alone. In particular, induction counterexamples often begin from "inductive starting states" which are in fact unreachable. In such a verification setting, it is critical to be able to present the user of the verification tool with a counterexample trace illustrating the scenario which fails an inductive check, as such feedback is critical to the user being able to augment his verification strategy.

Modern automated verification tools rely upon a large set of algorithms to enable efficient verification results. Particularly, they tend to rely upon reduction techniques which seek to reduce the size of the design under verification, to thereby yield exponential reductions to overall verification resources. For example, techniques such as "redundancy removal" may merge equivalent or constant gates and thereby reduce netlist size. There are many algorithmic frameworks wherein such redundant gates may be identified. The effectiveness of scalable light-weight proof techniques such as induction tends to be dramatically higher than that before such reduction, as the reductions themselves naturally rule out unreachable "inductive starting states" from the reduced netlist. "Lifting" inductive counterexamples, which constitute scenarios under which an inductive proof fails, is generally a challenging problem within a verification tool. First, such counterexamples do not originate from the designated initial states of a design; instead, they originate from an arbitrary inductive starting state. Second, in the presence of commonplace reduction techniques, care must be taken to ensure that the inductive starting state after such reductions may be mapped to one consistent with an inductive starting state before such reductions.

BRIEF SUMMARY

Disclosed are a method, a computing device and a computer program product that implement techniques for enabling the generation by a computer of adequate induction counterexamples to allow a user or automated process to infer the true reason for an inductive failure in a design and refine proof strategies accordingly. The method provides several computer-implemented techniques, including: a first computer-implemented technique for generating an inductive counterexample from a multi-algorithm verification framework; a second computer-implemented technique for generating an adequate inductive counterexample through inductively-provable redundancy removal; and a third computer-implemented technique for generating an adequate inductive counterexample through redundancy removal, which may not be inductively-provable.

One embodiment of the disclosure provides a method that includes the functions of: receiving an input of child trace having a partially-assigned induction counterexample trace from a child verification engine; generating a parent trace having a partially-assigned induction counterexample trace that is consistent with a parent verification engine; confirming a validity of a parent induction counterexample; assigning ternary values to each unassigned RANDOM gate and initial/base timeframe register valuations using three-valued simulation; propagating a minimal set of internal-gate valuations that are implied by the partially-assigned induction counterexample trace of the parent verification engine utilizing the assigned ternary values provided via the three-valued simulation; and minimizing assignments in the partially-assigned parent induction counterexample trace through: (a) iteratively converting one of a Boolean-assigned base timeframe register valuation and Boolean-assigned RANDOM gate valuation to a ternary X, then (b) repeating the three-valued simulation; and (c) assessing whether a result of the three-valued simulation still yields a valid induction counterexample.

A second embodiment of the disclosure provides a second method comprising: a processor of a computing device deriving a first unreachable state information that can be utilized to simplify the netlist; performing a simplification of the netlist utilizing the first unreachable state information; determining whether the simplification can be inductively proved on an original version of the netlist; and in response to the simplification not being inductively provable on the original version of the netlist: projecting the first unreachable state information to a minimal subset; adding the projected unreachable state information as an invariant to further constrain a child induction process; and in response to the simplification being inductively provable on the original version of the netlist, discarding the first unreachable state information. The first unreachable state information is discarded after simplifying the netlist in order to avoid burdening an efficiency of a subsequent verification. Adding the projected state information as an invariant ensures that any resulting induction counterexamples can be mapped to valid induction counterexamples on the original netlist before undergoing the simplification. Also, adding the projected state information as an invariant further ensures that induction counterexamples produced from post-simplification netlists can be consistently mappable to valid induction counterexamples on the original netlist before undergoing simplification.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments is to be read in conjunction with the accompanying drawings, wherein.

DETAILED DESCRIPTION

The illustrative embodiments provide a method, system and computer program product for constructing inductive counterexamples in a multi-algorithm verification framework. Specifically, the embodiments provide a method, a system and a computer program product that implement techniques for enabling the generation by a computer of adequate induction counterexamples to allow a user or automated process to infer the true reason for an inductive failure in a design and refine proof strategies accordingly. Generally, the method provides several computer-implemented techniques, including: a first computer-implemented technique for generating an inductive counterexample from a multi-algorithm verification framework; a second computer-implemented technique for generating an adequate inductive counterexample through inductively-provable redundancy removal; and a third computer-implemented technique for generating an adequate inductive counterexample through redundancy removal, which may not be inductively-provable.

In the following detailed description of exemplary embodiments of the disclosure, specific exemplary embodiments in which the disclosure may be practiced are described in sufficient detail to enable those skilled in the art to practice the disclosure, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

It is understood that the use of specific component, device and/or parameter names (such as those of the executing utility/logic described herein) are for example only and not meant to imply any limitations on the disclosure. The disclosure may thus be implemented with different nomenclature/terminology utilized to describe the components/devices/parameters herein, without limitation. Each term utilized herein is to be given its broadest interpretation given the context in which that terms is utilized. The below paragraphs thus introduces certain terminology and concepts that is utilized within the descriptions of the various embodiments of the disclosure.

Throughout the description of the various embodiments of the disclosure, the presented logic representation format of the logic design being evaluated is defined in terms of a netlist. As provided herein, a netlist contains a directed graph with vertices representing gates, and edges representing interconnections between those gates. The gates have associated functions, such as constants, primary inputs, combinational logic, such as AND gates, simple sequential elements, and memory arrays. Within the following descriptions, primary inputs shall be interchangeably referred to as RANDOM gates, and simple sequential elements shall be interchangeably referred to as registers. Registers have two associated components: the register's next-state functions and the register's initial-value functions. Both components are represented as other gates in the directed graph. Semantically, for a given register, the value appearing at the register's initial-value gate at time "0", which represents the "initialization" or "reset" time, will be applied as the value of the register itself The value appearing at the register's next-state function gate at time "i" will be applied to the register itself at time "i+1". A "state" is a valuation to the registers of a netlist. A state which may be witnessed within 0 or more transitions from the initial states is referred to as a "reachable state".

Within the netlist, certain gates are labeled as "targets". In the described embodiments, targets correlate to the properties for which verification is desired, and the goal of the verification process is to find a way to drive a logic "1" to a target node, or to prove that no such assertion of the target is possible. If a target may be asserted, a counterexample trace is often desired, comprising a sequence of valuations to the gates of a netlist. This sequence of valuations represents a method to transition the netlist from an initial state to a state asserting a selected target. Certain aspects of the embodiments provide enhancements of a technique referred to as induction. Induction is a relatively scalable proof technique, which consists of two parts: (1) a proof that the properties under consideration hold from times 0 . . . n, where time 0 refers to the initial states, and (2) considering any arbitrary state (m) which adheres to the properties under consideration and whose n−1 successor states also adhere to the properties, prove that the properties also hold in one additional state transition (i.e., n+1) from that arbitrary state. If the latter part of the induction technique succeeds, a conclusion can be made that the properties hold in all reachable states, without actually relying upon computationally expensive reachable state characterization algorithms. However, if the latter part of the induction technique fails, then whether the true verification process would pass or fail is generally unknown. Thus, the base state m from which induction fails may be reachable, in which case the property truly will fail. Further, the base state m may be unreachable, in which case the property truly may pass, unless an alternate induction counterexample exists which starts from a reachable state. When induction fails, it is often desirable to produce an induction counterexample to illustrate the inductive starting state m from which the induction was rendered inconclusive.

Additional aspects of the disclosure and the described embodiments refer to and utilize invariants. As utilized herein, an "invariant" is a redundant fact about netlist behavior. That is, the fact or condition presented by the invariant holds in all reachable states. An invariant may be represented as a specially-labeled gate, which evaluates to logic "1" in all reachable states. The present embodiments make use of the fact that invariants are useful in inductive frameworks, as the invariants can be used to constrain the induction base states and can thereby enhance the conclusiveness of induction.

Figure 1:
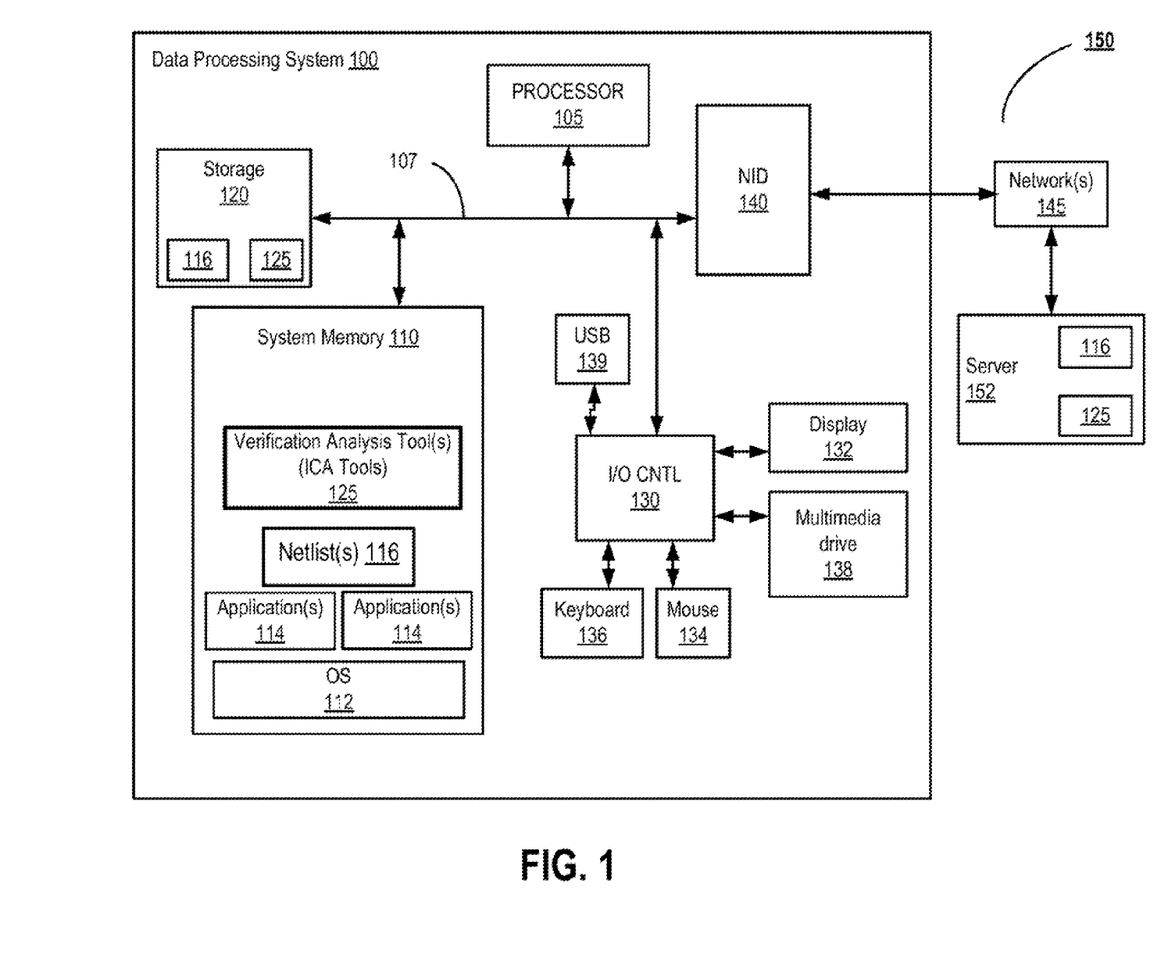
FIG. 1 provides a block diagram representation of an example data processing system within which the various embodiments of the disclosure can advantageously be implemented, according to one embodiment.

With reference now to the figures, and beginning with FIG. 1, there is depicted a block diagram representation of an example data processing system (DPS), within which the various computer-implemented methods of the disclosure along with the logic design of one or more target netlists can advantageously be implemented. DPS 100 sits within a DPS environment 150 that supports networking and/or other remote functionality of DPS 100. DPS 100 is configured to execute one or more analysis tools to analyze a logic design for correct operation, including specific tools and/or engines that enable the various aspects of the described embodiments. DPS 100 can take various forms and can be represented as a workstations, laptop computer systems, notebook computer systems, desktop computer systems and/or clusters thereof. While not preferable due to processor size constraints and the high computational requirements of the computer-implemented algorithms presented in the various described embodiments, DPS 100 can also be a smaller processing system, such as a smart phone, tablet PC, and the like, without limitation. DPS 100 includes a processor 105 or central processing unit (CPU), which may include one or more processor cores for executing program code. Processor 105 is coupled to a system memory 110 via a system interconnect or system bus 107. Also connected to processor 105 via system bus 107 are storage 120, input/output (I/O) adapter/controller 130, and network interface device (NID) 140. Coupled to I/O adapter/controller 130 are one or more output devices, of which display 132 is provided as an example, and one or more input devices, of which mouse 134 and keyboard 136 are presented as examples. Within the network environment 150, DPS 100 is communicatively connected to one or more wired or wireless networks 145, such as the Internet, to a server 152. Server 152 can be, for example, a tool server that facilitates download of various analysis tools 125 (e.g., verification, simulation, hardware acceleration, or synthesis tools) to DPS 100. Server 152 can also be a netlist server from which example netlist 116 can be downloaded for analysis.

In one embodiment, storage 120 maintains a copy of one or more netlists, including candidate netlist 116, which can be evaluated using the techniques described herein. Storage 120 can also maintain a copy of the various algorithms or analysis tools, generally illustrated with reference numeral 125, that are loaded into system memory prior to execution by processor 105 to implement the different functions presented herein. If is further appreciated that one or both of the analysis tools 125 and example netlist 116 can be obtained from an input device, such as a flash drive insertably coupled to USB 139 or Compact Disk or Digital Video Device coupled to and/or accessible via multimedia drive 138.

Loaded within system memory 110 are various executable program modules and/or software-coded algorithms, including, for example, operating system (OS) 112 of DPS 100, application programs 114 (e.g., a word processing application, a presentation application, and a netlist generation application). As shown, the program modules within memory 110 can also include an example logic design embodied as candidate netlist 116, and one or more verification analysis tool(s) 125 specific to the disclosure. Verification analysis tool(s) 125 is generally illustrated as contained within a single block; However, as presented by FIG. 2, described hereafter, verification analysis tool(s) 125 can include a plurality of different inductive counterexamples analysis (ICA) tool(s), and can be interchangeably referred to as ICA tools 125. In one or more embodiments, these ICA tool(s) 125 can include, for example, verification, simulation, and/or synthesis tools. Each tool can be an independent software module that executes on processor 105 to implement a specific set of verification analyses and/or functions when applied to candidate netlist 116.

Those of ordinary skill in the art will appreciate that the hardware components and basic configuration depicted in FIG. 1 may vary. The illustrative components within DPS 100 are not intended to be exhaustive, but rather are representative to highlight essential components that are utilized to implement the present disclosure. For example, other devices/components may be used in addition to or in place of the hardware depicted. The depicted example is not meant to imply architectural or other limitations with respect to the presently described embodiments and/or the general disclosure. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

Certain aspects of the disclosure involves the execution on or by processor 105 of DPS 100 of various algorithms and/or program modules provided by ICA tools 125 to yield results that can be outputted via one or more output mechanism, such as display 132. These algorithms are coded for execution on processor 105 to evaluate and/or analyze candidate netlist 116, and the execution by processor 105 and/or DPS 100 of these algorithms provides a computer-implemented method of performing inductive trace lifting within a multi-algorithm verification framework to produce valid induction counterexamples. In one embodiment, the method includes the functions of: receiving an input of child trace having a partially-assigned induction counterexample trace from a child verification engine; generating a parent trace having a partially-assigned induction counterexample trace that is consistent with a parent verification engine; confirming a validity of a parent induction counterexample; assigning ternary values to each unassigned RANDOM gate and initial/base timeframe register valuations using three-valued simulation; propagating a minimal set of internal-gate valuations that are implied by the partially-assigned induction counterexample trace of the parent verification engine utilizing the assigned ternary values provided via the three-valued simulation; and minimizing assignments in the partially-assigned parent induction counterexample trace through: (a) iteratively converting one of a Boolean-assigned base timeframe register valuation and Boolean-assigned RANDOM gate valuation to a ternary X, then (b) repeating the three-valued simulation; and (c) assessing whether a result of the three-valued simulation still yields a valid induction counterexample.

In one or more embodiments, the method further includes: determining whether a minimized simulation trace still represents a valid parent counterexample trace; in response to determining that a minimized simulation trace still represents a valid parent counterexample trace, continuing minimization with the minimized simulation trace; and in response to determining that a minimized simulation trace does not represent a valid parent counterexample trace: discarding the minimization; and initiate processing of a next minimization with a prior parent counterexample trace.

Further, in one embodiment, generating the partially-assigned induction counterexample trace can include: lifting one or more RANDOM gate valuations from the child trace into the parent trace; and lifting one or more register valuations from an initial timeframe (t0) of the child trace into the parent trace. Also, confirming a validity of a parent induction counterexample can include: reflecting any recorded logic simplifications performed by the parent verification engine within the parent induction counterexample trace; and/or populating additional valuations in the parent induction counterexample trace reflecting the recorded logic simplifications.

In one or more of the embodiments, execution of the algorithms by the processor enable completion by a computing device of a second method for simplifying a netlist via inductive trace lifting within a multi-algorithm verification framework. The method includes: a processor of a computing device deriving a first unreachable state information that can be utilized to simplify the netlist; performing a simplification of the netlist utilizing the first unreachable state information; determining whether the simplification can be inductively proved on an original version of the netlist; and in response to the simplification not being inductively provable on the original version of the netlist: projecting the first unreachable state information to a minimal subset; and adding the projected unreachable state information as an invariant to further constrain a child induction process. Further, the method includes: in response to the simplification being inductively provable on the original version of the netlist, discarding the first unreachable state information. The first unreachable state information is discarded after simplifying the netlist in order to avoid burdening an efficiency of a subsequent verification. According to the described embodiments, adding the projected state information as an invariant ensures that any resulting induction counterexamples can be mapped to valid induction counterexamples on the original netlist before undergoing the simplification. Also, adding the projected state information as an invariant further ensures that induction counterexamples produced from post-simplification netlists can be consistently mappable to valid induction counterexamples on the original netlist before undergoing simplification. One additional aspect of the disclosure provides that the method includes recording the simplification of the netlist; and performing a later trace reconstruction utilizing the recorded simplification of the netlist.

Figure 2:
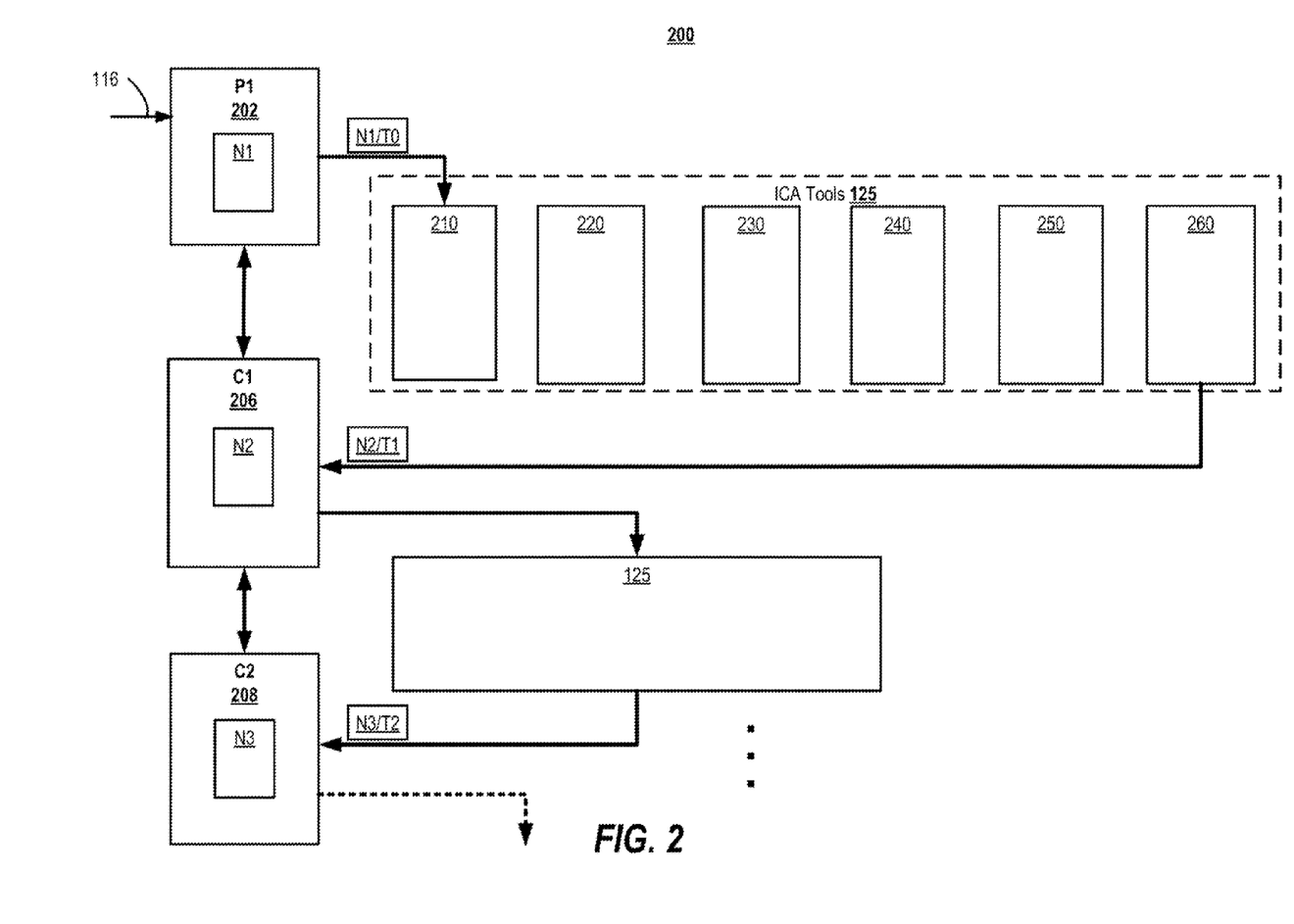
FIG. 2 illustrates a block diagram representation of functional modules of an inductive verification framework that implement the functions associated with one or more computer-implemented algorithms within the various embodiments.

Referring now to FIG. 2, there is provided a sequence diagram of a multi-algorithm verification framework, which shall be referred to herein as inductive counterexample multi-algorithm (ICM) system 200. The description of the embodiments of the disclosure generally provides a method to generate an inductive counterexample from ICM system 200. With a normal counterexample trace, the only "critical" valuations are those to RANDOM gates, as these combine with the designated initial states of the netlist (example candidate netlist 116) to concretely demonstrate a target assertion. In an inductive counterexample, the valuations of importance are both those valuations to the RANDOM gates as well as the valuations to registers representing the inductive starting state. The desired goal of the inductive counterexample is to yield a minimally-assigned counterexample, where as few as possible values to the RANDOM gates (and registers, for inductive counterexamples) are provided, while still ensuring that any extension of the resulting minimally-assigned counterexample can still witness an assertion of the corresponding target. This minimality enables the person and/or computer-implemented algorithm analyzing such a trace to focus only upon the truly relevant aspects of the trace. Nonetheless, it is often practically necessary to include all values that are implied by others to enable comprehension of the resulting minimal counterexample. Thus, in one implementation, assignments to the RANDOM gates (and registers, for inductive counterexamples) can often be directly minimized. Following the minimization, a process such as three-valued logic simulation can be utilized to assess which internal gates may be ascribed concrete values accordingly.

In the illustrated multi-algorithm verification framework of ICM system 200 of FIG. 2, a series of synergistic transformations can be leveraged to iteratively simplify a problem until the problem becomes tractable for a core verification algorithm, such as induction (via verification analysis module 210. Thus, as shown by FIG. 2, the synergistic transformations can be accomplished through encapsulating multiple algorithms as "engines" of a modular multiple-engine based verification system (ICM system 200). Throughout the description of the disclosure references to each specific algorithm is intended to refer to the internal code that enables a specific corresponding verification analysis module of the ICM system 200. The functionality of the algorithm is therefore assumed to be equivalent to the corresponding verification analysis module and both terms can therefore be interchangeably utilized.

Three levels of engines are illustrated within the ICM (verification) system 200, labeled as (P1-C1-C2), where P1 references the parent or initial engine that receives the example candidate netlist 116, C1 references a first child engine that receives a reduced netlist (N2) for analysis and/or evaluation from P1, and C2 references a next downstream child engine (i.e., grandchild of parent) that receives from child C1 a further reduced netlist (N3) for continued analysis and/or evaluation. It is appreciated that while a sequence of two levels of child engines are shown, the actual number of levels of child engines is variable ranging from 0 to M, with M being an integer value, and the actual number utilized may depend on the initial candidate netlist inputted at the parent engine and the amount of processing and/or transformations required to resolve the particular verification of interest. Each child engine is illustrated connected to its parent engine via a bi-directional arrow representing the flow of a netlists in the direction of parent to child, and the flow of traces from child to parent. Each of the three illustrated engines is shown having a corresponding netlist (N1, N2, N3), and each engine can either simplify the given netlist or attempt to solve the corresponding verification problem. In the case of the engine simplifying the netlist, following the simplification, e.g., at parent engine (P1) of netlist (N1), the resulting simplified netlist (N2) is passed to child engine (C1), which may benefit from the reductions performed by parent engine (P1) to solve the resulting netlist more easily. Alternatively, child engine (C1) can further reduce the netlist (N2) and passed the twice-reduced netlist (N3) to the next level child engine (C2).

It is generally possible that a gate of netlist (N1) in the parent engine (P1) may not need to be passed to a child engine (C1) whatsoever, e.g., if the gate became irrelevant through the reductions of netlist (N1). Alternatively, in one or more embodiments, it is possible that multiple gates of netlist (N1) in the parent engine (P1) map to the same gate in child engine (C1), and the child engine (C1) can perform some on-the-fly reductions of the netlist (N2) as the child engine (C1) receives the problem (i.e., reduced netlist N2).

Returning now to the description of FIG. 2, ICM system 200 comprises a plurality of processing engines, generally referenced as a parent engine (P1) 202 and child engines (C1) 206 and (C2) 208. Within each engine is a sequence of analysis modules, which collectively represent ICA tools 125. Within the disclosure, each analysis module within ICA tools 125 represents the functionality provide by execution of specific individual algorithms within ICA tools 125. The algorithms support different aspects of the disclosure, and several aspects are captured and presented as one or more methods within the incorporated flow chart descriptions hereinafter. Also illustrated within ICM system 200 are directional paths and/or links established between (P1) 202 and (C1) 206. The directional links include a first netlist processing link or path through ICA 125 through which a candidate netlist 116 is routed and which generates the simplified netlist that is provided as an input to child engine, (C1) 206. The direction links also includes a second "verification feedback" link or path by which (P1) 202 receives verification results such as a "trace" from (C1) 206. This second path enables (C1) 206 to map the trace to one consistent with its parent and further propagate the mapped trace to the parent. ICA tools 125 of each engine and in particular of (P1) 202 includes first verification analysis module 210, which receives an initial input that is indicated as being example candidate netlist 116 (FIG. 1). Candidate netlist 116 is indicated as parent netlist, N1, within P1 202. Subsequent processed/reduced versions of the parent netlist (116) can be referenced as Nth child netlist or trace, where N is an integer value representing the number of iterations of parent-child reductions made from the original candidate netlist 116. For simplicity, only the first child netlist/trace, N1/T0, and second child netlist/trace, N2/T1, are presented and referenced herein. It is however appreciated that the number of traces of child netlists is variable and no limitations are implied by the presentation of only two levels of child netlists that were trace lifted from the original candidate netlist 116.

First verification analysis module 210 of ICA tools 125 comprises a "parent to Nth child" induction trace lifting module. For specific reference to the module by its functional purpose and/or utility, the first verification analysis module can also be interchangeably referred to as trace lifting module 210. As described below, trace lifting module 210, as with each of the modules described herein, can itself comprise multiple iterative sub-modules that can operate on a given input of candidate netlist 116 representing the parent netlist, N1, or subsequent iterations of the netlist, within a child engine.

According to the first aspect of the disclosure, a first computer implemented algorithm is provided to perform trace lifting for induction counterexamples. Execution by the processor 105 (FIG. 1) of the below algorithm, which is encoded within first verification analysis module 210, enables the performance of trace lifting for induction counterexamples. As will be established below, additional processing is necessary in case the "induction trace lifting algorithm" of first verification analysis module 210 performs reductions on the netlist. The algorithm (or pseudo-code) for induction trace lifting is generally presented as follows (where each leading number refers to a next line of the pseudo-code and indentation in the pseudo-code indicates the start and end of an iteration, such as a "for" loop and/or a "while" loop.):

1: trace lift_induction_trace(parent, child, trace t)
{
2: trace t2=empty_trace( )
3. for each RANDOM and register gate "g" in parent let "h" be the child mapping for "g"
4. if "h" is undefined, continue populate values for "h" in trace t to values for "g" in t2; for all time-frames of "t" if "g" is a RANDOM gate, else only for time 0 if "g" is a register
6. perform three-valued simulation on t2 beginning from its current partial inductive state to maximally define values to internal gates implied by those currently in t2
7. return t2
}

Processor execution of induction trace lifting algorithm populates values from a child trace "t" into a new trace, "t2", consistent with the parent netlist, N1. These populated values are limited to those of RANDOM gates and registers, as such values are the basis of those values that are important to trace reconstruction. Furthermore, values to RANDOM gates are important at all time-frames, whereas those for registers are only important at the base time-frame ("time 0") to define the inductive starting state. According to one or more embodiments, the inductive starting state does not need to be an initial state, which directly contrasts with traditional non-induction traces.

In a second aspect of the disclosure, a second computer-implemented algorithm is provided by second verification analysis module 220. The second algorithm populates all internal gate values that are implied by those lifted by the earlier-executed induction trace lifting algorithm. According to one implementation of this second algorithm, populating all internal gate values that are implied is accomplished through three-valued simulation. It should be noted that with the above algorithm 1, three-valued simulation is also utilized with the functions performed by code line 6. However, in addition to three-valued simulation, algorithm 2 also provides minimization. In the three-valued simulation, all RANDOM gates and registers which have defined Boolean values from the induction trace lifting algorithm are used to imply values to internal gates, and the other RANDOM gates and registers are conservatively assumed to attain ternary "X" or "unknown" values. By utilizing standard three-valued simulation in this form, the computer-implemented algorithm can maximally propagate implied values while retaining the desired scenario of not creating unnecessary Boolean values. However, in some implementations, there may nonetheless be more Boolean assignments to registers and RANDOM gates in the trace than are truly necessary. This situation is particularly true when leveraging the subsequent functionality of the disclosure to ensure validity of the resulting lifted induction counterexample trace. Accordingly, the second verification analysis module 220 is extended to include additional pseudo-code to compensate for this lack of minimality. This second algorithm is generally presented with the following pseudo-code, which provides a framework for minimal induction trace lifting:

1. trace lift_induction_trace_minimized(parent, child, trace t)
{
2. trace t2=empty_trace( );
3. for each RANDOM and register gate "g" in parent, let "h" be the child mapping for "g"
4. if "h" is undefined, continue
5. populate values for "h" in trace t to values for "g" in t2, for all time-frames of "t" if "g" is a RANDOM gate, else only for time 0 if "g" is a register
6. perform three-valued simulation on t2 beginning from its current partial inductive state to maximally define values to internal gates implied by those currently in t2
7. while (not done)

8. choose a Boolean-valued register from time 0, or Boolean-valued RANDOM gate from any timeframe, to attempt to eliminate from the counterexample trace
9. replace the selected valuation with a ternary X value in t2, resulting in t3
10. perform three-valued simulation on t3 to assess whether it still constitutes a valid induction counterexample
11. if so, replace t2 with t3;
12. else discard t3
13. determine whether or not process is "done" attempting to minimize the trace, e.g. according to a resource limit or whether all candidate eliminations have been attempted
14. return t2
}

One aspect of the present disclosure is the recognition that minimizing the number of Boolean values in induction traces, particularly those to registers in the base timeframe, is generally desirable. A user who is to understand the root cause of the induction counterexample will need to focus his attention upon those Boolean assignments. The above second algorithm provides a suitable extension to automatically achieve such minimization, through iteratively choosing Boolean-valued registers from timeframe 0 and RANDOM gates that the algorithm will attempt to eliminate from the trace. In one embodiment, such minimization can be accomplished through providing a ternary X on the chosen register or RANDOM gate, and re-simulating the trace to see if the result still yields a valid induction counterexample. As there generally may be a large number of registers and RANDOM gates in the netlist, the effectiveness of the second algorithm is reliant, in practice, on the fact that the induction trace lifting algorithm (first algorithm) upon which the second algorithm is based begins with a partially-assigned trace from a child verification flow to reduce the number of minimization attempts the second algorithm makes.

While the first and second verification analysis modules (210 and 220) provide a general architectural tool and/or mechanism to enable the propagation of induction counterexamples through a transformation-based verification toolset, implementation of these algorithms does not solve the problem that a specific netlist reduction performed by a given engine may be critical to tightening the space of inductive counterexamples and thus the reduction needs to be accounted for when reporting a valid induction counterexample to avoid having the induction counterexample illustrating a bogus scenario for the parser of the induction counterexample to debug. When a netlist is passed from one engine (e.g., P1) to a successor engine (e.g., C1) in a transformation-based verification framework, there are many points at which redundant gates may be eliminated. For example, a netlist reduction algorithm corresponding to third verification analysis module 230 can choose to make changes directly to the current netlist in the form of "merging" two functionally equivalent gates. When two gates "a" and "b" are merged, all fanout connections of gate b are reconnected to gate a, allowing gate b to fall out of the cone-of-influence of downstream logic, and gate a is recorded as the "canonical" function for gate b. Alternatively, the netlist reduction algorithm (230) may instead choose to provide a list of desired substitutions to be made as the netlist is being transferred to (i.e. reconstructed in) a successor engine (e.g., C2).

In one embodiment, additional redundancies can be detected and removed during netlist construction in the successor engine due to on-the-fly simplifications, such as structural hashing. With structural hashing, previously-created gates are recorded, and when a new gate is to be created, an assessment is first made whether a corresponding gate has already been created. If a corresponding gate has already been created, the previously-created gate is returned. Otherwise, a new gate is created if a corresponding gate has not already been created. The result of this redundant gate elimination is that there may be a many-to-one relationship from gates in an initial netlist (e.g., N1) to equivalent gates in a simplified netlist (e.g., C1). In one aspect of the disclosure, the existing parent-to-child mapping is mined via the third computer-implemented algorithm to establish complete equivalence classes over nodes in the parent netlist (N1). During lifting of induction traces, these equivalence classes are used to ensure that all gates within an equivalence class are assigned to consistent values. The third algorithm is generally presented with the following pseudo-code, which provides a method for identifying equivalent parent gates.

1. create_equiv_classes(parent, child, parent_to_child_map)
{
2. initialize_equiv_classes( )
3. child_to_parent_map=empty_map( )
4. for each gate "g" in parent netlist, let "h"=parent_to_child_map[get_canonical(g)]
5. if h is undefined, continue
6. let "r"=child_to_parent_map[h]
7. if r is undefined, child_to_parent_map[h]=r
8. else if r !=g, merge_equiv_classes(r, g)
}

This third algorithm illustrates one embodiment of how equivalence information is mined from the parent-to-child mappings after a netlist (N1) has been transferred to a child engine (e.g., C1). Initially, each gate belongs to its own, unique equivalence class. When two gates are identified as equivalent, the corresponding equivalence classes of the two gates are merged into a single equivalence class. In at least one embodiment, the equivalence classes can be efficiently implemented as circular, singly-linked lists. A sub-routine referred to herein as "get_canonical(g)" is implemented in the parent (e.g., P1 202) to assess whether gate "g" has been merged onto another gate within the parent. If gate "g" has not been merged onto another gate, "get_canonical(g)" returns an output of "g". However, if gate "g" has been merged onto another gate, "get_canonical(g)" returns the gate onto which "g" was merged.

While the third algorithm provides a mechanism for establishing equivalent gate information for a single parent (P1) to child (C1) transfer, for certain implementations maintaining the netlist, the parent-to-child mappings, and the equivalence class information for every step in the transformation based run is not desirable. Rather, in one or more embodiments, several transformation steps are aggregated together and the intermediate netlists discarded to conserve memory resources. In such cases, the third algorithm can be extended to provide a fourth algorithm within fourth verification analysis module 240. The fourth algorithm is provided to maintain a single set of equivalence classes for the original netlist, incrementally updating the single set of equivalence classes after each intermediate netlist transfer. This fourth algorithm is generally represented with the following pseudo-code, which provides a method for incrementally identifying equivalent gates in an original netlist.

1. update_equiv_classes(orig, parent, child, parent_to_orig_map, parent_to_child_map)
{
2. child_to_orig_map=empty_map( )

3. for each gate "g" in parent netlist, let "f"=parent_to_orig_map[g]
4. if f is undefined, continue
5. let "h"=parent_to_child_map[get_canonical(g)]
6. if h is undefined, continue
7. let "r"=child_to_orig_map[h]
8. if r is undefined, child_to_orig_map[h]=r
9. else if r !=f, merge_equiv_classes(r, f)
10. parent_to_orig_map[g]=r II avoid redundant future merges
}

Using the equivalent gate information provided by the fourth algorithm, the first verification analysis module 210 can be enhanced to populate equivalent gates with consistent values. In addition, a fifth verification analysis module 250 providing a corresponding fifth algorithm can be provided, which provides an enhanced minimal induction trace lifting for application in a multi-algorithm verification framework, i.e., ICM system 200. This fifth algorithm is generally represented by the following pseudo-code.

1. trace lift_induction_trace(parent, child, trace)
{
2. trace t2=empty_trace( )
3. for each RANDOM and register gate "g" in parent, let "h" be the child mapping for "g", i.e. child_to_parent_map[h]=g
4. if "h" is undefined, continue
5. for each RANDOM and register gate "e" in same equivalence class as "g", populate values for "h" in trace t to values for "e" in t2; for all time-frames of "t" if "g" is a RANDOM gate
6. else only for time 0 if "g" is a register
7. perform three-valued simulation on t2 beginning from its current partial inductive state to maximally define values to internal gates implied by those currently in t2
8. while (not done)
9. choose a Boolean-valued register from time 0, or Boolean-valued RANDOM gate from any timeframe to attempt to eliminate from the counterexample trace
10. replace the selected valuation with a ternary X value in t 2, resulting in t3
11. perform three-valued simulation on t3 to assess whether it still constitutes a valid induction counterexample
12. if so, replace t2 with t3;
13. else discard t3
14. determine whether or not we are "done" attempting to minimize the trace, e.g. according to a resource limit or whether all candidate eliminations have been attempted
}

The fifth algorithm provides a method for enhanced minimal induction trace lifting. General concepts of this method are further illustrated by the flow chart of FIG. 3. Method 300 is performed by processor execution of the above introduced fifth program module 250 represented by the above listed pseudo-code of fifth algorithm. Method 300 begins at block 302 and proceeds at block 304 with processor 105 receiving parent, child and initial trace information and initializing the data structure for the next trace (T2). Method 300 then includes assigning child mappings (H) for each random gate and each register gate in the parent trace (306). With the child mappings assigned, processor 105 populates values from the register gate in the parent at initial time t0 (block 308) and also populates values from RANDOM gates for all time frames into T2 (block 310). In deciding which gates to populate into T2, the method includes a check for all gates in T2 that are in the same equivalence class as gates in T, and those gates with the same equivalence class are the ones whose value is populated into T2. The method next includes initiating and/or performing three-valued simulation on T2, beginning from a current partial inductive state (block 312). The three-valued simulation defines values to the internal gates that are implied by values in T2. The method then includes selecting Boolean-valued registers from the initial time (t0) and/or selecting Boolean-valued random gates from any time (block 314). With these Boolean valued gates selected, the method replaces the selected value with a ternary X value in T2 (block 318). This process generates a tentative T3.

Figure 3:
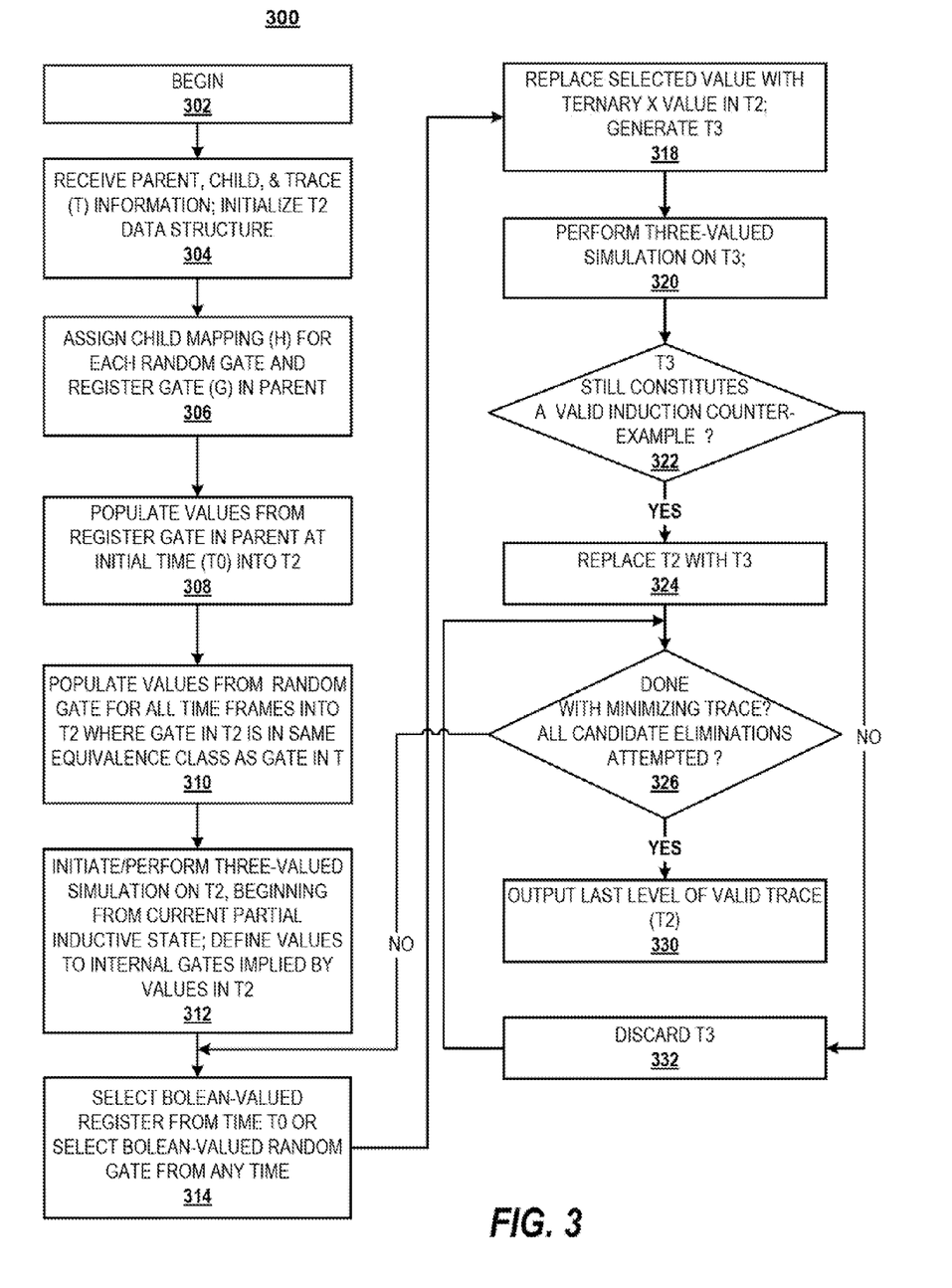
FIG. 3 is a flow chart of a first computer-implemented method for performing minimal induction trace lifting in a multi-algorithm verification framework, according to one embodiment.

The method then includes performing three-valued simulation on the generated T3 (block 320) and determining whether the generated T3 still constitutes a valid induction counter-example (block 322). In response to T3 being a valid induction counter-example, the method includes replacing the T2 with T3 (block 324). In response to T3 not being a valid induction counterexample, the method also includes discarding T2. However, if T3 does not constitute a valid inductive counter-example, the method includes discarding T3 (block 332) The method then determines whether all candidate eliminations have been attempted, indicating that the minimizing trace iterations have been exhausted (block 326). When the process of minimizing traces is complete, the processor 105 outputs the final/last valid trace, which in most instances will be T2 (block 330). However, if the process of minimizing traces is not complete (at block 326), the method 300 returns to block 314 to select a next register or random gate to process.

The fourth algorithm and fifth algorithm provide a robust method (500) to support efficient induction counterexample lifting through arbitrary reductions, which may be inductively demonstrated. However, in some implementations, there exist cases where recording equivalence information alone is not sufficient. For example, in certain scenarios, there is a possibility that the elimination of equivalent gates will change the design or the resulting netlist in subtle ways such that the netlist design (e.g., N3) as seen by the child engine (e.g., C2 208) can assume inductive behaviors and states that are impossible in the original netlist design (N1). For example, if simplifying the equivalences results in additional registers being introduced in the child engine then these additional registers may assume values that have no correlation to any state of the netlist (N1) in the parent engine (P1 202). Similarly, in some embodiments, an engine can utilize "unreachable state" information to enable a particular reduction. "Unreachable state information" can, for example, indicate that a particular set of registers always assumes a "one-hot" valuation, i.e., that exactly one of the set of registers evaluates to 1 in any reachable state. Such information can generally be represented as an "invariant". If the unreachable state invariants may not be inductively provable, then additional accounting for the invariant must be performed, as will be illustrated by the flow chart of FIG. 4.

The following example illustrates why such invariants may be necessary to ensure valid parent counterexamples. The example considers a netlist (e.g., N1) with three registers, R1, R2, and R3. In this example, R1 initializes to 1 and has next-state function "R1 AND (NOT CLK)". R2 initializes to 1 and has next-state function "(NOT R3)". R3 initializes to 0 and has next-state function 1. CLK (indicating a periodic clock signal) initializes to 0 and toggles between 0 and 1 every timestep. With these initial values and next state functions, the following behavior can be observed or evaluated over time for each register, along every valid trace:

| | |
|---|---|
| CLK | 01010101... |
| R1 | 11000000... |
| R2 | 11000000... |
| R3 | 01111111... |

From the above, one possible unreachable-state invariant is that R1 and R2 evaluate to the same value in all reachable states. Thus, R1 and R2 can be merged. For purposes of the example, R1 is assumed to be merged onto R2 and thus R1 no longer exists in the simplified netlist (e.g., N2). However, if R1 is merely merged into R2, the resulting netlist may exhibit an induction counterexample starting from a state where R2=R3=0. The resulting trace, with values of R1 copied from R2, would appear as follows:

| | |
|---|---|
| CLK | 01010101... |
| R1 | 01000000... |
| R2 | 01000000... |
| R3 | 01111111... |

However, there is no such induction counterexample valid on the original netlist (N1) and thus the above represents an invalid induction counterexample. If merged gate R1 would inductively initialize to 0, R1 would stay 0 forever because its next-state function is "R1 AND (NOT CLK)". Thus, regardless of the value of CLK the initialization of 0 to R1 would prevent R1 from ever becoming 1. The root cause of this problem is that the unreachability invariant utilized to enable this reduction of the merging of R1 and R2 is not inductively-provable. However, such a reduction could be achieved using an approximate reachable-state enumeration system such as is illustrated by the flow chart of FIG. 4 and described hereinafter. The approximate reachable-state enumeration system can identify that the reachable state valuations are <CLK,R1,R2,R3>=<0110,1111,0001,1001>, as can be seen by analyzing the trace above. The disjunction of these four set of valuations may be represented as an invariant. Once R1 is merged onto R2, the resulting invariant in the post-simplified netlist reduces to <CLK,R2,R3>=<010,111,–01> where the dash "-" reflects a don't care. The most important point reflected in this invariant is that <R2, R3> can never evaluate to <00>, which was the cause of the invalid induction counterexample.

The above example illustrates that it is generally critical and even valuable to propagate unreachable state information to a child verification engine (C1) 206, to ensure that any induction counterexample traces produced by that child may correlate to the original netlist (N1). However, for optimality of the overall verification process, minimizing the number of such invariants propagated can be critical to the overall implementation, as these invariants have an overhead to the subsequent verification process. With the presence of these invariants needing to be given proper consideration, ICA tools 125 further provides sixth verification analysis module 260 having a corresponding sixth algorithm. The below pseudo-code of the sixth algorithm provides a method for introducing invariants to assist induction trace lifting under non-inductive reductions. General aspects of the sixth algorithm are also presented by the flow chart of FIG. 4.

Figure 4:
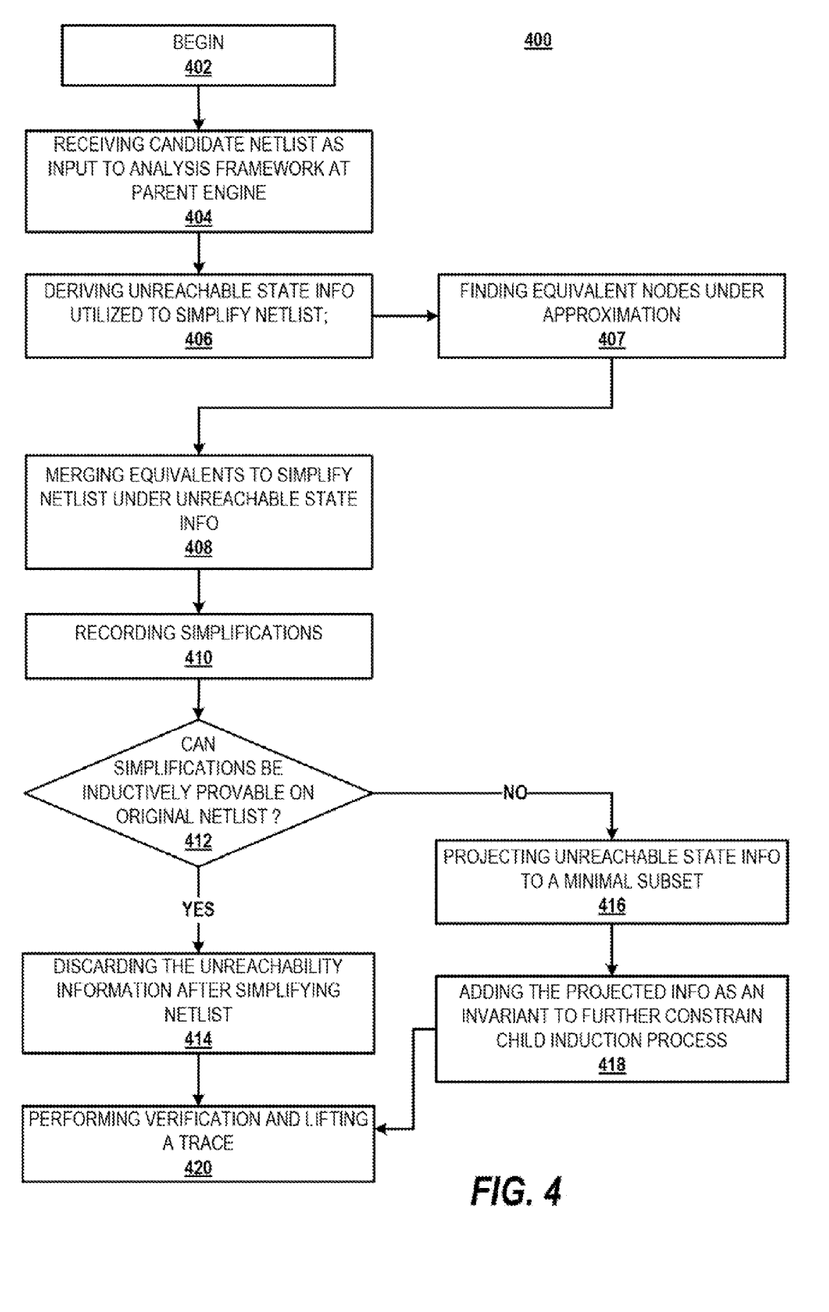
FIG. 4 is a flow chart of a second computer-implemented method for introducing invariants during induction trace lifting under non-inductive reductions, according to one embodiment.

1. trace verify_under_noninductive_reductions( )
{
2. approx=generate reachability approximation
3. equivs=find equivalent nodes under "approx"
4. merge "equivs" to simplify the netlist
5. for each simplification s1 in "equivs": check whether s1 may be inductively provable on original netlist
6. if s1 is not inductively provable in the original netlist, project "approx" down to the logic in the fanin of s1;
7. record the resulting "approx" as an invariant
8. use any arbitrary child verification engines to attempt to solve the simplified netlist under the "approx" invariant
9. if child engine yields a counterexample trace, lift the trace using the 5$^{th}$ Algorithm and return the resulting trace
}

According to one embodiment, sixth computer-implemented algorithm of ICA Tools 125 solves the problem of un-realizable child states by selectively introducing invariants. Often equivalences hold on every reachable state but not on every state in general, i.e. on inductive states. If knowledge about the reachable state space is used to enable a merge, then this knowledge may need to be recorded as an invariant. Many techniques may be used to compute an approximation of reachable state space. These techniques are generally represented by the process "generate reachability over-approximation." For example, three-valued simulation may be performed, which introduces a ternary "X" value to RANDOM gates, until a repetition of a 3-valued state is witnessed, which further indicates that all reachable states have been explored. In one aspect, analysis of the resulting enumerated states can identify gates that are constant or equivalent, and which may therefore be merged.

FIG. 4 is a flow chart illustrating the method for simplifying a netlist and ensuring that induction counterexamples produced from post-simplification netlists are consistently mappable to valid induction counterexamples on the pre-simplification netlist, while retaining overall optimality. The method 400 begins at block 402 and proceeds to block 404 with processor 105 receiving a netlist as an input to the ICM system 200 and then the processor, through execution of one or more of the sequence of described computer-executable modules, deriving some unreachable state information which may be used to simplify the netlist (block 406). The method 400 then provides processor 105 finding equivalent nodes under approximation (block 407), simplifying the netlist under the unreachable state information (block 408), and recording the simplifications to be used for later trace reconstruction (block 410). The method then comprises deriving if the simplifications may be inductively provable on original netlist (block 412), and if the unreachable state information is inductively provable on the original netlist (N1), discarding the unreachability information after simplifying the netlist to avoid burdening subsequent verification efficiency (block 414). However, if the unreachable state information cannot be inductively provable, then the method implements the functions of projecting the unreachable state information to a minimal subset and adding the projected unreachable state information as an invariant to further constrain a child induction process (block 416). By performing the function of adding the projected unreachable state information as an invariant, the method ensures that any resulting induction counterexamples can be mapped to valid induction counterexamples on the pre-simplification netlist. In one embodiment, and as illustrated, method functions of block 414 and 418 can proceed to performing verification and lifting a trace (block 420).

It is noteworthy, as presented by the above described example, that failure to reflect any used reachability information as an invariant for subsequent verification may otherwise violate the desired behavior of the fifth algorithm in yielding a proper induction trace, if the reachability information is itself not derivable using simple inductive reasoning. The sixth algorithm corrects this problem by propagating any used unreachability information as an invariant to be passed to the child verification engine (C1 206), and the child verification engine (C1 206) guarantees that all states along the inductive trace satisfy the invariant. In this way, the ICM system 200 guarantees that all states on the inductive trace will be realizable in the parent engine (P1 202).

However, one aspect of the disclosure involves a recognition that always passing such unreachability information can result in unacceptable performance degradation for the subsequent verification process, as these invariants add to the size of the netlist and add overhead to an induction engine. Therefore, the algorithm first makes a determination of whether each individual reduction reflected using the unreachability information is itself inductively provable as valid. If the unreachability information is itself inductively provable as valid, no further action is necessary. However, if the unreachability information is not itself inductively provable as valid, the parent engine (P1) propagates the resulting unreachability information to the child engine (C1) 206. However, given the overhead of doing so, that characterization can also be projected down to the logic, which is in the fan-in of the gates remaining after simplification to minimize the size of the resulting invariant and overhead.

Figure 5:
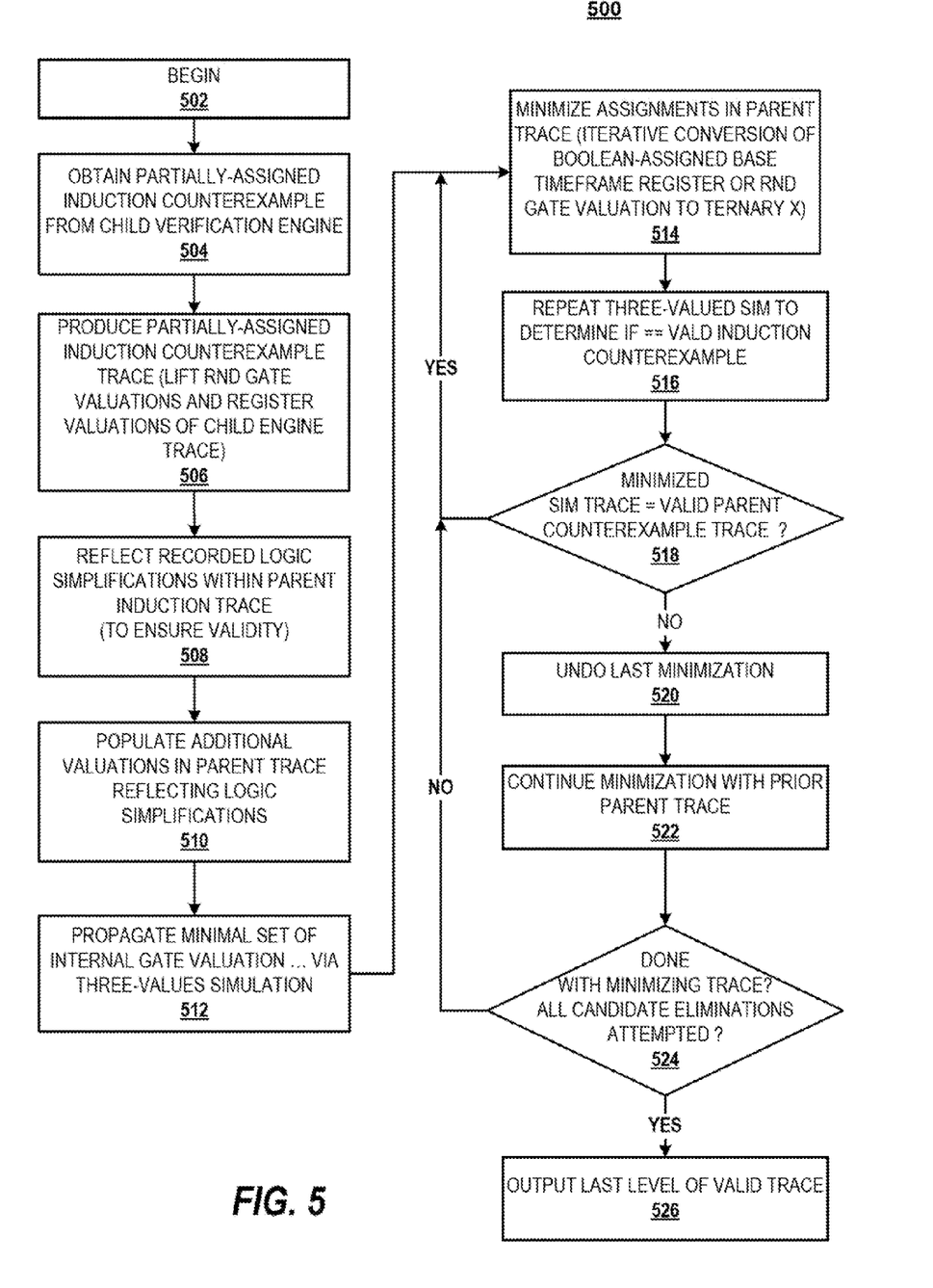
FIG. 5 is a flow chart illustrating a third computer-implemented method that performs induction trace lifting in a multi-algorithm verification framework with use of three valued analyses and invariants, according to one embodiment.

Referring now to FIG. 5, there is illustrated a flow chart of one embodiment of a method for producing optimal and valid induction counterexamples in a multi-algorithm verification framework. Method 500 is performed by processor execution of one or more of the above introduced program modules within ICA Tools 125 with an example candidate netlist 116. Method 500 begins at block 502 and proceeds with processor 105 obtaining a partially-assigned induction counterexample trace from a child verification engine (e.g., C1), shown at block 504. The method then includes the processor producing a partially-assigned induction counterexample trace consistent with the parent verification engine (P1) by (a) lifting RANDOM gate valuations from the child engine trace into the parent engine trace and (b) further lifting register valuations from the base timeframe of the child engine trace into the parent engine trace (block 506). The method then includes the processor 105 ensuring the validity of the parent induction counterexample by reflecting any recorded logic simplifications performed by the parent engine within the parent induction counterexample trace (block 508). This process further includes populating additional valuations in the parent induction counterexample trace, reflecting the recorded logic simplifications (block 510). The method 500 provides for propagating a minimal set of internal-gate valuations that are implied by the partially-assigned parent induction counterexample trace via three-valued simulation (block 512). During this application of three-valued simulation, unassigned RANDOM gates and base timeframe register valuations are treated as ternary values. The method 500 also comprises further minimizing assignments in the partially-assigned parent induction counterexample trace through iteratively converting (1) a Boolean-assigned base timeframe register valuation or (2) Boolean-assigned RANDOM gate valuation to a ternary X (block 514). The method repeats the three-valued simulation to assess if the result still yields a valid induction counterexample (block 516). Then, if as determined at block 518, the minimized simulation trace still represents a valid parent counterexample trace, the method returns to block 514. However, if the minimized simulation trace does not represent a valid parent counterexample trace, the method provides the function of undoing the minimization (block 520) and continuing minimization with the prior parent coun-terexample trace (block 522). The method then determines whether all candidate eliminations have been attempted, indicating that the minimizing trace iterations have been exhausted (block 524). When the process of minimizing traces is complete, the processor 105 outputs the final trace (block 526). However, if the process of minimizing traces is not complete (at block 524), the method 500 returns to block 514.

In each of the flow charts above, one or more of the methods may be embodied in a computer readable medium containing computer readable code such that a series of functions are performed when the computer readable code is executed on a computing device. In some implementations, certain steps of the methods are combined, performed simultaneously or in a different order, or perhaps omitted, without deviating from the spirit and scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, R.F, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, the processes in embodiments of the present disclosure may be implemented using any combination of software, firmware or hardware. As a preparatory step to practicing the disclosure in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the disclosure. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the disclosure may be practiced by combining one or more machine-readable storage devices containing the code according to the present disclosure with appropriate processing hardware to execute the code contained therein. An apparatus for practicing the disclosure could be one or more processing devices and storage systems containing or having network access to program(s) coded in accordance with the disclosure.

Thus, it is important that while an illustrative embodiment of the present disclosure is described in the context of a fully functional computer (server) system with installed (or executed) software, those skilled in the art will appreciate that the software aspects of an illustrative embodiment of the present disclosure are capable of being distributed as a program product in a variety of forms, and that an illustrative embodiment of the present disclosure applies equally regardless of the particular type of media used to actually carry out the distribution.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method for simplifying a netlist via an inductive trace lifting within a multi-algorithm verification framework, the method comprising:
   a processor of a computing device deriving first unreachable state information that can be utilized to simplify the netlist;

performing a simplification of the netlist utilizing the first unreachable state information; determining whether the first unreachable state information can be inductively proved on an original version of the netlist; and in response to the first unreachable state information not being inductively provable on the original version of the netlist:

projecting the first unreachable state information to a minimal subset; and said adding the projected unreachable state information as an invariant to further constrain a child induction process, wherein adding the projected first unreachable state information as an invariant ensures that any resulting induction counterexamples can be mapped to valid induction counterexamples on the original version of the netlist before undergoing the simplification.

2. The method of claim 1, further comprising:

in response to the first unreachable state information being inductively provable on the original version of the netlist, discarding said first unreachable state information, wherein said first unreachable state information is discarded after simplifying the netlist in order to avoid burdening an efficiency of a subsequent verification.

3. The method of claim 1, wherein said adding the projected first unreachable state information as an invariant further ensures that induction counterexamples produced from post-simplification netlists can be consistently mappable to valid induction counterexamples on the original version of the netlist before undergoing the simplification.

4. The method of claim 1, further comprising:

recording said simplification of the netlist; and performing a later trace reconstruction utilizing the recorded simplification of the netlist.

5. The method of claim 1, wherein said determining whether the first unreachable state information can be inductively proved on the original version of the netlist comprises determining whether said first unreachable state information is inductively provable on the original version of the netlist.

6. A computer program product comprising:

a computer readable device; and program code on the computer readable device for simplifying a netlist via an inductive trace lifting within a multi-algorithm verification framework, the program code comprising instructions that when executed by a processor of a computing device, causes the computing device to:

derive first unreachable state information that can be utilized to simplify the netlist;

perform a simplification of the netlist utilizing the first unreachable state information;

determine whether the first unreachable state information can be inductively proved on an original version of the netlist; and in response to the first unreachable state information not being inductively provable on the original version of the netlist: project the first unreachable state information to a minimal subset; and add the projected first unreachable state information as an invariant to further constrain a child induction process, wherein said adding the projected first unreachable state information as an invariant ensures that any resulting induction counterexamples can be mapped to valid induction counterexamples on the original version of the netlist before undergoing the simplification.

7. The computer program product of claim 6, wherein the program code further comprises instructions that cause the computing device to:

in response to the first unreachable state information being inductively provable on the original version of the netlist, discard said first unreachable state information, wherein said first unreachable state information is discarded after simplifying the netlist in order to avoid burdening an efficiency of a subsequent verification.

8. The computer program product of claim 6, wherein the instructions that cause the computing device to add the projected first unreachable state information as an invariant further comprises instructions that cause computing device initiated functions that ensure that induction counterexamples produced from post-simplification netlists can be consistently mappable to valid induction counterexamples on the original version of the netlist before undergoing the simplification.

9. The computer program product of claim 6, wherein the program code further comprises instructions that cause the computing device to:

record said simplification of the netlist; and perform a later trace reconstruction utilizing the recorded simplification of the netlist.

10. The computer program product of claim 6, wherein the instructions that cause the computing device to determine whether the first unreachable state information can be inductively proved on the original version of the netlist comprises instructions that cause the computing device to determine whether said first unreachable state information is inductively provable on the original version of the netlist.

11. A computer-implemented method for producing valid induction counterexamples in a multi-algorithm verification framework, the method comprising:

receiving an input of a child trace having a partially-assigned induction counterexample trace from a child verification engine;

generating a parent trace having a partially-assigned parent induction counterexample trace that is consistent with a parent verification engine;

assigning ternary values to each unassigned RANDOM gate and initial/base timeframe register valuations using a three-valued simulation;

propagating a minimal set of internal-gate valuations that are implied by said partially-assigned parent induction counterexample trace of the parent verification engine utilizing the assigned ternary values provided via the three-valued simulation; and minimizing assignments in said partially-assigned parent induction counterexample trace through: (a) iteratively converting one of a Boolean-assigned base timeframe register valuation and Boolean-assigned RANDOM gate valuation to a ternary operation, then (b) repeating the three-valued simulation; and (c) assessing whether a result of the three-valued simulation still yields a valid induction counterexample.

12. The method of claim 11, further comprising:

determining whether a minimized simulation trace still represents a valid parent counterexample trace;

in response to determining that a minimized simulation trace still represents a valid parent counterexample trace, continuing minimization with the minimized simulation trace; and in response to determining that a minimized simulation trace does not represent a valid parent counterexample trace: discarding the minimization; and initiating processing of a next minimization with a prior parent counterexample trace.

13. The method of claim 11, wherein said generating a parent trace having a partially-assigned induction counterexample trace comprises:
   lifting one or more RANDOM gate valuations from said child trace into said parent trace; and
   lifting one or more register valuations from an initial timeframe of said child trace into said parent trace.

14. The method of claim 11, further comprising assuring a validity of a parent induction counterexample trace by reflecting any recorded logic simplifications performed by said parent verification engine within said parent induction counterexample trace.

15. The method of claim 14, wherein the assuring a validity of a parent induction counterexample further comprises populating additional valuations in said parent induction counterexample trace reflecting said recorded logic simplifications.

16. A computer program product comprising a computer readable device and program code on the computer readable device for producing valid induction counterexamples in a multi-algorithm verification framework, said program code, when executed by a processor of a computing device, causes the computing device to:
   receive an input of a child trace having a partially-assigned induction counterexample trace from a child verification engine;
   generate a parent trace having a partially-assigned parent induction counterexample trace that is consistent with a parent verification engine;
   assign ternary values to each unassigned RANDOM gate and initial/base timeframe register valuations using a three-valued simulation;
   propagate a minimal set of internal-gate valuations that are implied by said partially-assigned parent induction counterexample trace of the parent verification engine utilizing the assigned ternary values provided via the three-valued simulation; and
   minimize assignments in said partially-assigned parent induction counterexample trace through: (a) iteratively converting one of a Boolean-assigned base timeframe register valuation and Boolean-assigned RANDOM gate valuation to a ternary operation, then (b) repeating the three-valued simulation; and (c) assessing whether a result of the three-valued simulation still yields a valid induction counterexample.

17. The computer program product of claim 16, wherein the program code further causes the computing device to:
   determine whether a minimized simulation trace still represents a valid parent counterexample trace;
   in response to determining that a minimized simulation trace still represents a valid parent counterexample trace, continue minimization with the minimized simulation trace; and
   in response to determining that a minimized simulation trace does not represent a valid parent counterexample trace: discard the minimization; and initiate processing of a next minimization with a prior parent counterexample trace.

18. The computer program product of claim 16, wherein the program code that causes the computing device to generate a parent trace having a partially-assigned induction counterexample trace comprises code that causes the computing device to:
   lift one or more RANDOM gate valuations from said child trace into said parent trace; and
   lift one or more register valuations from an initial timeframe of said child trace into said parent trace.

19. The computer program product of claim 16, wherein the program code further comprises program code that causes the computing device to assure a validity of a parent induction counterexample trace by reflecting any recorded logic simplifications performed by said parent verification engine within said parent induction counterexample trace.

20. The computer program product of claim 19, wherein the program code that causes the computing device to confirm a validity of a parent induction counterexample trace further comprises program code that causes the computing device to populate additional valuations in said parent induction counterexample trace reflecting said recorded logic simplifications.

* * * * *